United States Patent
Liu et al.

(10) Patent No.: US 9,349,760 B2
(45) Date of Patent: May 24, 2016

(54) METHOD OF MANUFACTURING A TFT-LCD ARRAY SUBSTRATE HAVING LIGHT BLOCKING LAYER ON THE SURFACE TREATED SEMICONDUCTOR LAYER

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Xiang Liu, Beijing (CN); Zhenyu Xie, Beijing (CN); Xu Chen, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 14/638,478

(22) Filed: Mar. 4, 2015

(65) Prior Publication Data

US 2015/0179686 A1 Jun. 25, 2015

Related U.S. Application Data

(62) Division of application No. 12/835,019, filed on Jul. 13, 2010, now abandoned.

(30) Foreign Application Priority Data

Jul. 13, 2009 (CN) .......................... 2009 1 0088291

(51) Int. Cl.
*G02F 1/1362* (2006.01)
*H01L 29/49* (2006.01)
(Continued)

(52) U.S. Cl.
CPC .......... *H01L 27/1288* (2013.01); *G02F 1/1368* (2013.01); *G02F 1/136286* (2013.01);
(Continued)

(58) Field of Classification Search
CPC combination set(s) only.
See application file for complete search history.

(56) References Cited

U.S. PATENT DOCUMENTS

2004/0110343 A1 6/2004 Machida et al.
2006/0139548 A1 6/2006 Ahn
(Continued)

FOREIGN PATENT DOCUMENTS

CN 1992350 A 7/2007
CN 101005083 A 7/2007
(Continued)

OTHER PUBLICATIONS

USPTO NFOA dated Sep. 13, 2012 in connection with U.S. Appl. No. 12/835,019.
(Continued)

*Primary Examiner* — Lauren Nguyen
(74) *Attorney, Agent, or Firm* — Ladas & Parry LLP (57) ABSTRACT

A thin film transistor liquid crystal display (TFT-LCD) array substrate comprises a gate line, a data line, a pixel electrode and a thin film transistor. The pixel electrode and the thin film transistor are formed in a pixel region defined by intersecting of the gate line and the data line, and the thin film transistor comprises a gate electrode, a semiconductor layer, a source electrode and a drain electrode. Two separate parts of the surface of the semiconductor layer are treated by a surface treatment to form into an ohmic contact layer, and the source electrode and the drain electrode are connected with the semiconductor layer through the ohmic contact layer in the two separate parts, respectively.

2 Claims, 6 Drawing Sheets

(51) Int. Cl.
  *H01L 27/12* (2006.01)
  *H01L 29/66* (2006.01)
  *H01L 29/786* (2006.01)
  *G02F 1/1368* (2006.01)
  *H01L 21/027* (2006.01)
  *H01L 21/311* (2006.01)

(52) U.S. Cl.
  CPC ...... *H01L21/0271* (2013.01); *H01L 21/31111* (2013.01); *H01L 21/31133* (2013.01); *H01L 27/1214* (2013.01); *H01L 29/66765* (2013.01); *H01L 29/78618* (2013.01); *G02F 2001/136236* (2013.01); *G02F 2001/136295* (2013.01); *H01L 29/4908* (2013.01)

(56) References Cited

U.S. PATENT DOCUMENTS

| | | |
|---|---|---|
| 2006/0290867 A1 | 12/2006 | Ahn et al. |
| 2007/0145374 A1 | 6/2007 | Whangbo et al. |
| 2007/0246707 A1 | 10/2007 | Deng et al. |
| 2008/0002125 A1 | 1/2008 | Kim |
| 2008/0003784 A1 | 1/2008 | Pan |
| 2008/0105873 A1 | 5/2008 | Wang et al. |
| 2009/0152635 A1 | 6/2009 | Jeong et al. |

FOREIGN PATENT DOCUMENTS

| | | |
|---|---|---|
| CN | 101078843 A | 11/2007 |
| JP | 2005-317923 A | 11/2005 |

OTHER PUBLICATIONS

USPTO FOA dated Mar. 7, 2013 in connection with U.S. Appl. 12/835,019.
USPTO NFOA dated Nov. 8, 2013 in connection with U.S. Appl. 12/835,019.
USPTO FOA dated Apr. 3, 2014 in connection with U.S. Appl. No. 12/835,019.
USPTO NFOA dated Aug. 14, 2014 in connection with U.S. Appl. No. 12/835,019.
USPTO FOA dated Dec. 4, 2014 in connection with U.S. Appl. No. 12/835,019.

METHOD OF MANUFACTURING A TFT-LCD ARRAY SUBSTRATE HAVING LIGHT BLOCKING LAYER ON THE SURFACE TREATED SEMICONDUCTOR LAYER

BACKGROUND

Embodiments of the present invention relate to a thin film transistor liquid crystal display (TFT-LCD) array substrate and a method of manufacturing the same.

Thin film transistor liquid crystal displays (TFT-LCDs) device have the advantages of small volume, low energy consumption, low radiation and the like, and thus have prevailed in the flat plate display market. As for TFT-LCDs, the performance, yield and cost are mainly determined by an array substrate of a TFT-LCD and a manufacturing method thereof. In order to effectively reduce the cost and improve the yield, the process of manufacturing a TFT-LCD array substrate is gradually simplified from the initial 7-mask process to the present 4-mask process employing a half-tone mask or a gray-tone mask.

Presently, the manufacture of a TFT-LCD array substrate can be performed by forming a series of thin film patterns through a series of patterning process. Generally, one layer of thin film pattern is formed through one patterning process. In the 4-mask process, an active layer, a date line, a source electrode, a drain electrode and a TFT channel region can be formed by one patterning process with a half-tone mask or a gray-tone mask. The active layer comprises a semiconductor film and a doped semiconductor film (ohmic contact film) that are stacked in order. During forming the TFT channel region, the doped semiconductor film is etched by a dry etching process. In order to etch away the doped semiconductor film in the TFT channel region and realize the uniformity and selectivity of such etch, an over-etching process is performed until a portion of the semiconductor film provided below the doped semiconductor film is etched. Thus, the semiconductor film must have a large thickness, such as 1500 Å-3000 Å.

According to the definition of the turn-off current of a thin film transistor, the turn-off current of the thin film transistor is proportional to the thickness of the semiconductor film. The turn-off current of the thin film transistor is increased with the increase of the thickness of the semiconductor film. Because of the increased turn-off current of the thin film transistor, the leakage current is increased, the period, during which the voltage of a pixel electrode is held, is shortened, and thus the performance of the TFT-LCD array substrate comprising the thin film transistor as a switch element for a pixel is degraded. Furthermore, during etching the doped semiconductor film and the semiconductor film through a conventional dry etching process, the surface of the semiconductor film in the TFT channel region is roughed due to the physical bombing, and thus the performance of the TFT-LCD array substrate is further degraded. In addition, during forming the TFT channel region by using the half-tone mask or the gray-tone mask, failures (for example, the short circuit between the source electrode and the drain electrode, the open circuit of the channel region, and the like) are caused by the multiple-step etching process, and thus the yield is severely reduced.

SUMMARY

According to an embodiment of the invention, a thin film transistor liquid crystal display (TFT-LCD) array substrate comprising a gate line, a data line, a pixel electrode and a thin film transistor, wherein the pixel electrode and the thin film transistor are formed in a pixel region defined by intersecting of the gate line and the data line, and the thin film transistor comprises a gate electrode, a semiconductor layer, a source electrode and a drain electrode, and wherein two separate parts of the surface of the semiconductor layer are treated by a surface treatment to form into an ohmic contact layer, and the source electrode and the drain electrode are connected with the semiconductor layer through the ohmic contact layer in the two separate parts, respectively.

According to another embodiment of the invention, a method of manufacturing a thin film transistor liquid crystal display (TFT-LCD) array substrate comprising: Step 1 of sequentially depositing a transparent conductive film and a gate metal film on a substrate, and patterning the transparent conductive film and the gate metal film to form a pixel electrode, a gate line and a gate electrode; Step 2 of depositing a gate insulating layer and a semiconductor film on the substrate after the Step 1 and patterning the semiconductor film to form a semiconductor layer, wherein two separate parts of the surface of the semiconductor layer is treated by a surface treatment process to form into an ohmic contact layer; and Step 3 of depositing a source/drain metal film on the substrate after the Step 2, and patterning the source/drain metal film to form a data line, a source electrode and a drain electrode by a patterning process, wherein the source electrode and the drain electrode respectively are connected with the semiconductor layer through the ohmic contact layer in the two separate parts.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from the following detailed description.

BRIEF DESCRIPTION OF THE DRAWINGS

The present invention will become more fully understood from the detailed description given hereinafter and the accompanying drawings which are given by way of illustration only, and thus are not limitative of the present invention and wherein.

DESCRIPTION OF THE EMBODIMENTS

Hereinafter, the embodiments of the invention will be described in detail with the accompanying drawings.

Figure 1:
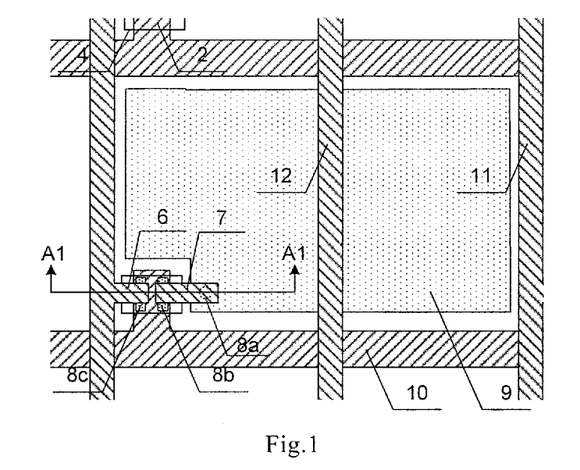
FIG. 1 is a plan view showing a first embodiment of a TFT-LCD array substrate according to the invention.
Figure 2:
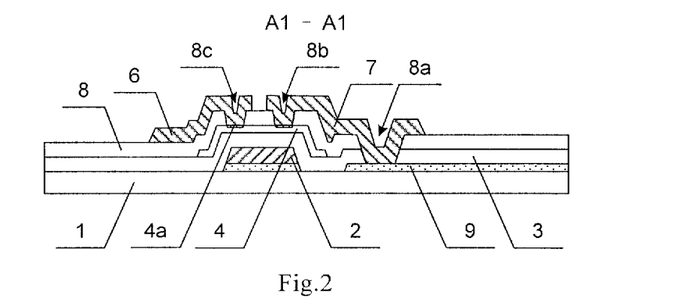
FIG. 2 is a sectional view taken along line A1-A1 in FIG. 1.

FIG. 1 is a plan view showing a first embodiment of a TFT-LCD array substrate according to the invention, and FIG. 2 is a sectional view taken along line A1-A1 in FIG. 1.

As shown in FIG. 1 and FIG. 2, the TFT-LCD array substrate according to this embodiment comprises gate lines 10, data lines 11, common electrode lines 12, pixel electrodes 9 and thin film transistors. A pixel region is defined by intersecting of one gate line 10 and one data line 11 perpendicular to each other. One thin film transistor and one pixel electrode are formed in each pixel region. The gate line 10 is used to supply the turn-on ("ON") signals to the thin film transistor, the data line 11 is used to supply the data signals to the pixel electrode 9, and the common electrode line 12 is used to constitute storage capacitor with the pixel electrode 9.

Specifically, the TFT-LCD array substrate according to this embodiment comprises a gate electrode 2, the gate line 10 and the pixel electrode 9, which are all formed on a substrate 1. The gate electrode 2 is connected with the gate line 10. The pixel electrode 9 is formed on the substrate 1 and within the pixel region. A gate insulating layer 3 is formed on the gate electrode 2, the gate line 10 and the pixel electrode 9 to cover the entirety of the substrate 1. A semiconductor layer 4 is formed on the gate insulating layer 3 and positioned over the gate electrode 2. A passivation layer 8 is formed on the semiconductor layer 4 to cover the entirety of the substrate 1. A first via hole 8a, a second via hole 8b and a third via hole 8c are provided in the passivation layer 8. The first via hole 8a is provided on the pixel electrode 9 and exposes a portion of the surface of the pixel electrode 9. The second via hole 8b and the third via hole 8c are provided on the semiconductor layer 4 and each expose a portion of the surface of the semiconductor layer 4. The surface of the semiconductor layer 4 exposed by the second via hole 8b and the third via hole 8c comprises an ohmic contact layer 4a formed by surface treatment as described below. The data line 11, the common electrode line 12, the source electrode 6 and the drain electrode 7 are formed on the passivation layer 8. One end of the source electrode 6 is connected with the data line 11, the other end thereof is positioned over the semiconductor layer 4 and connected with the semiconductor layer 4 through the ohmic contact layer 4a in the third via hole 8c. One end of the drain electrode 7 is connected with the pixel electrode 9 through the first via hole 8a, the other end thereof is positioned over the semiconductor layer 4 and connected with the semiconductor layer 4 through the ohmic contact layer 4a in the second via hole 8b. A TFT channel region is formed between the source electrode 6 and the drain electrode 7. In another embodiment, the common electrode line 12 is not formed.

In this embodiment, the thickness of the semiconductor layer 4 is about 500-1500 Å, and preferably is about 500-1000 Å. The surface treatment to the semiconductor layer 4 is a phosphorizing treatment using $PH_3$ gas, in which the RF power is about 5-12 KW, the atmospheric pressure is about 100-400 mT and the flow rate is about 1000-4000 sccm. In addition, the gate electrode 2, the gate line 10 and the pixel electrode 9 may be formed in a single patterning process or in different patterning processes.

FIG. 3 to FIG. 12 are schematic views showing the manufacture process of the first embodiment of the TFT-LCD array substrate according to the invention. Hereinafter, the described patterning process may comprise the processes of applying photoresist, masking, exposing and developing of photoresist, etching, removing remaining photoresist, and the like. For example, a positive photoresist is used as an example in a patterning process.

Figure 3:
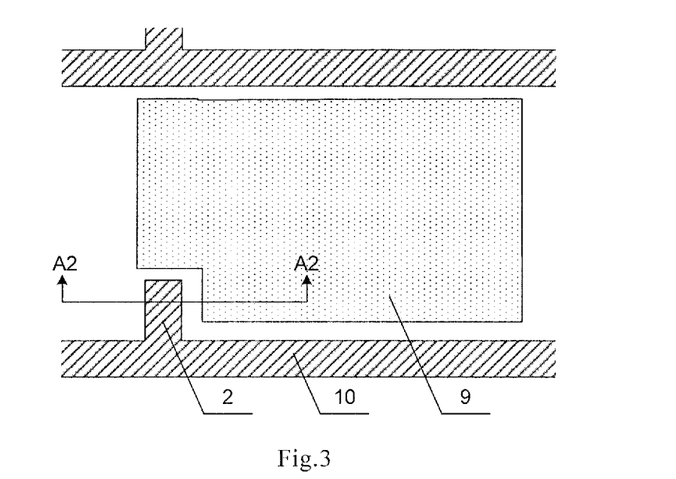
FIG. 3 is a plan view after a first patterning process of the first embodiment of the TFT-LCD array substrate according to the invention.
Figure 4:
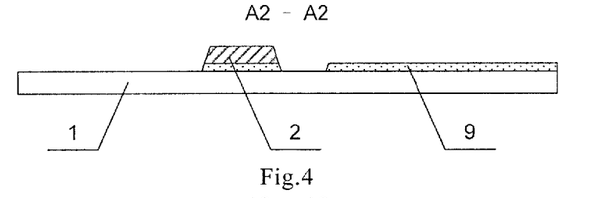
FIG. 4 is a sectional view taken along the line A2-A2 in FIG. 3.

FIG. 3 is a plan view after a first patterning process of the first embodiment of the TFT-LCD array substrate according to the invention, and FIG. 4 is a sectional view taken along the line A2-A2 in FIG. 3.

A transparent conductive film with a thickness of about 300-600 Å and a gate metal film with a thickness of about 500-4000 Å are deposited on the substrate 1 by a magnetron sputtering method, a thermal evaporation method or other film formation method. The transparent conductive film may be formed by indium tin oxide (ITO), indium zinc oxide (IZO), aluminum zinc oxide (AZO) and the like or by other metal or metal oxide. The gate metal film may be formed by a metal such as Cr, W, Ti, Ta, Mo, Al, Cu and the like or an alloy of the above metals. In addition, the gate metal film may have a multi-layer structure formed by any combination of the above metals. By a patterning process using a half-tone mask or a gray-tone mask, the gate electrode 2, the gate line 10 and the pixel electrode 9 are formed on the substrate, as shown in FIG. 3 and FIG. 4. Such patterning process is described in detail as follows.

Figure 5:
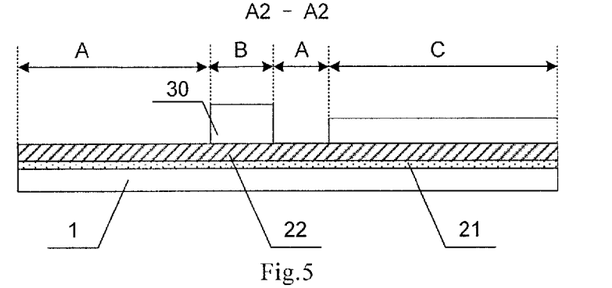
FIG. 5 is a sectional view taken along the line A2-A2 after exposing and developing a phororesist layer in the first patterning process of the first embodiment of the TFT-LCD array substrate according to the invention.

FIG. 5 is a sectional view taken along the line A2-A2 after exposing and developing a photoresist layer in the first patterning process of the first embodiment of the TFT-LCD array substrate according to the invention.

After the transparent conductive film 21 and the gate metal film 22 are sequentially deposited on the substrate 1, a photoresist layer 30 is applied on the gate metal film 22. The photoresist layer 30 is exposed by using a half-tone mask or a gray tone mask to form a completely exposed region A, an unexposed region B and a partially exposed region C. The unexposed region B corresponds to the regions of the gate line and the gate electrode, the partially exposed region C corresponds to the region of the pixel electrode, and the completely exposed region A corresponds to the region other than the above regions. After the developing process is performed, the thickness of the photoresist in the unexposed region B is not substantially changed to form a photoresist-completely-retained region, the photoresist in the completely exposed region A is completely removed to form a photoresist-completely-removed region, and the thickness of the photoresist in the partially exposed region C is decreased to form a photoresist-partially-retained region, as shown in FIG. 5.

Figure 6:
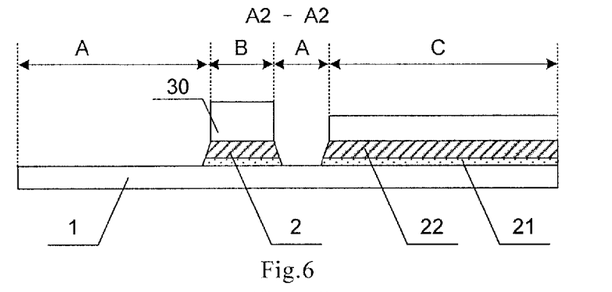
FIG. 6 is a sectional view taken along the line A2-A2 after a first etching process in the first patterning process of the first embodiment of the TFT-LCD array substrate according to the invention.

FIG. 6 is a sectional view taken along the line A2-A2 after a first etching process in the first patterning process of the first embodiment of the TFT-LCD array substrate according to the invention. By the first etching process, the gate metal film 22 and the transparent conductive film 21 in the completely exposed region A are etched away so that the gate line 10 and the gate electrode 2 are formed, as shown in FIG. 6.

Figure 7:
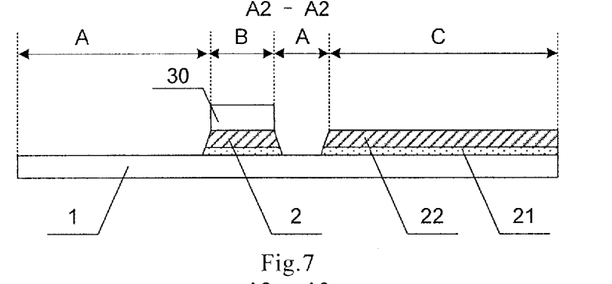
FIG. 7 is a sectional view taken along the line A2-A2 after an ashing process in the first patterning process of the first embodiment of the TFT-LCD array substrate according to the invention.

FIG. 7 is a sectional view taken along the line A2-A2 after an ashing process in the first patterning process of the first embodiment of the TFT-LCD array substrate according to the invention. By the ashing process, the thickness of the photoresist layer 30 is decreased so that the photoresist in the partially exposed region C is completely removed to expose the gate metal film 22 in this region, as shown in FIG. 7. Since the thickness of photoresist in the unexposed region B is bigger than that in the partially exposed region C, the unexposed region B is still covered by remaining photoresist with a certain thickness after the ashing process.

Figure 8:
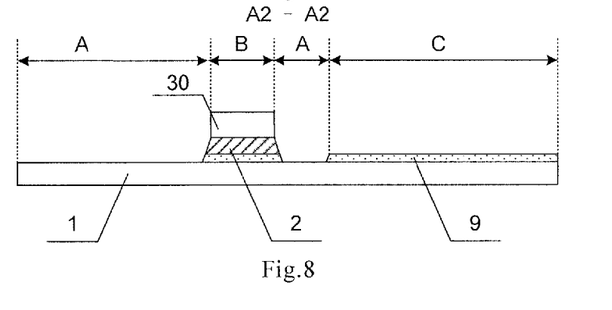
FIG. 8 is a sectional view taken along the line A2-A2 after a second etching process in the first patterning process of the first embodiment of the TFT-LCD array substrate according to the invention.

FIG. 8 is a sectional view taken along the line A2-A2 after a second etching process in the first patterning process of the first embodiment of the TFT-LCD array substrate according to the invention. By the second patterning process, the gate metal film in the partially exposed region C is etched so that in this region the gate metal film is etched away and the transparent conductive film is exposed, and thus the exposed transparent conductive film in this region forms the pixel electrode 9, as shown in FIG. 8.

Then, the remaining photoresist is removed to complete the first patterning process of the TFT-LCD array substrate in this embodiment. As shown in FIG. 3 and FIG. 4, the pixel electrode is formed on the substrate 1 and the transparent conductive film is retained below the gate line 10 and the gate electrode 2 after the first patterning process.

Figure 9:
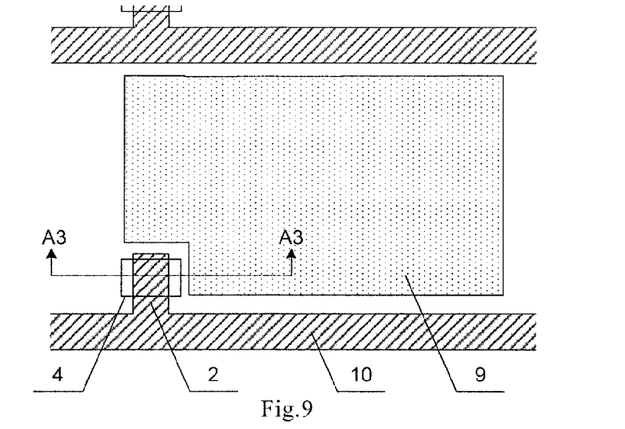
FIG. 9 is a plan view after a second patterning process of the first embodiment of the TFT-LCD array substrate according to the invention.
Figure 10:
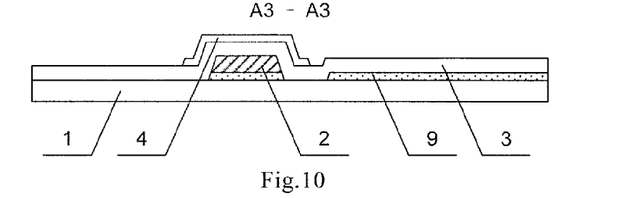
FIG. 10 is a sectional view taken along line A3-A3 in FIG. 9.

FIG. 9 is a plan view after a second patterning process of the first embodiment of the TFT-LCD array substrate according to the invention, and FIG. 10 is a sectional view taken along line A3-A3 in FIG. 9.

On the substrate 1 with the pattern shown in FIG. 3, the gate insulating layer 3 with a thickness of about 3000-5000 Å and a semiconductor film with a thickness of about 500-1500 Å are sequentially deposited by a plasma enhanced chemical vapor deposition (PECVD) method or other film formation method. The gate insulating layer 3 may be formed of an oxide, a nitride or an oxynitride, and the corresponding source gas thereof may be a mixture of $SiH_4$, $NH_3$ and $N_2$ or a mixture of $SiH_2Cl_2$, $NH_3$ and $N_2$. The semiconductor film may be an amorphous silicon film, and the corresponding source gases thereof may be a mixture of $SiH_4$ and $H_2$ or a mixture of $SiH_2Cl_2$ and $H_2$. Then, the semiconductor layer 4 is formed by a patterning process using a normal mask, as shown in FIG. 9 and FIG. 10. After the second patterning process, the gate insulating layer 3 is formed on the gate electrode 2, the gate line 10 and the pixel electrode 9 to cover the entirety of the substrate 1, and the semiconductor layer 4 is formed on the gate insulating layer 3 and positioned over the gate electrode 2.

Figure 11:
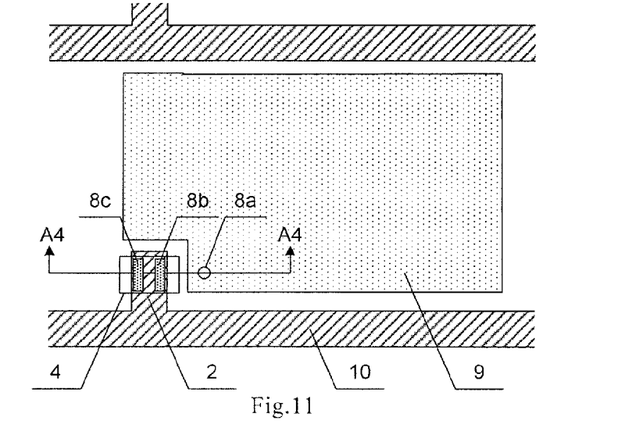
FIG. 11 is a plan view after a third patterning process of the first embodiment of the TFT-LCD array substrate according to the invention.
Figure 12:
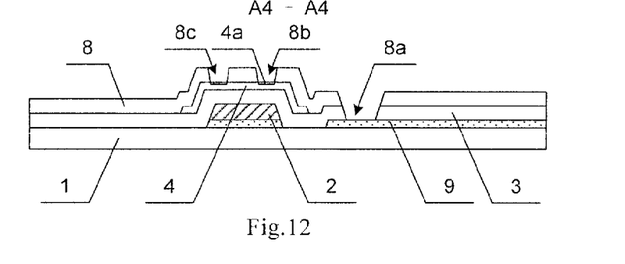
FIG. 12 is a sectional view taken along line A4-A4 in FIG. 11.

FIG. 11 is a plan view after a third patterning process of the first embodiment of the TFT-LCD array substrate according to the invention, and FIG. 12 is a sectional view taken along line A4-A4 in FIG. 11.

On the substrate with the pattern shown in FIG. 9, the passivation layer 8 with a thickness of about 700-2000 Å is deposited by a PECVD method or other film formation method. The passivation layer 8 may be formed by an oxide, a nitride or an oxynitride, and the corresponding source gas thereof may be a mixture of $SiH_4$, $NH_3$ and $N_2$ or a mixture of $SiH_2Cl_2$, $NH_3$ and $N_2$. The first via hole 8a, the second via hole 8b and the third via hole 8c are formed by a patterning process using a normal mask. The first via hole 8a is provided on the pixel electrode 9 and near the gate electrode 2. The passivation layer 8 and the gate insulating layer 3 in the first via hole 8a are etched away to expose the surface of the pixel electrode 9 in the first via hole 8a. The second via hole 8b and the third via hole 8c are provided on the semiconductor layer 4. The passivation layer 8 in both the second via hole 8b and the third via hole 8c are etched away to exposed the surface of the semiconductor layer in the second via hole 8b and the third via hole 8c. The surface of the semiconductor layer 4 exposed in the second via hole 8b and the third via hole 8c is treated with a surface treatment process so that the surface of the semiconductor layer 4 in the second via hole 8b and the third via hole 8c is formed into the ohmic contact layer 4a, as shown in FIG. 11 and FIG. 12. In the third patterning process, the gate pad via hole (not shown) may be simultaneously formed in the gate pad region. The structure of the gate pad via hole are well-known to those skilled in the art and detailed descriptions thereof are omitted here for simplicity. The surface treatment in this embodiment is a phosphorizing treatment using $PH_3$ gas, in which the RF power is about 5-12 KW, the atmospheric pressure is about 100-400 mT and the flow rate is about 1000-4000 sccm. The second via hole 8b and the third via hole 8c may be provided on both sides of the semiconductor layer 4 over the gate electrode 2 (as shown this embodiment), or on both sides of the semiconductor layer 4 outside of the gate electrode 2. The shape of the via holes may be rectangular, elliptical or circular, and the length, width and other geometrical parameters thereof may be determined depending on the practical requirements.

Finally, a source/drain metal film with a thickness of about 2000-3000 Å is deposited on the substrate with the pattern shown in FIG. 12 by using a magnetron sputtering method, a thermal evaporation method or other film formation method. The source/drain metal film may be formed by a metal such as Cr, W, Ti, Ta, Mo, Al, Cu and the like or an alloy of the above metals. In addition, the source/drain metal film may have a multi-layer structure formed by any combination of the above metals. The data line 11, the common electrode line 12, the source electrode 6 and the drain electrode 7 are formed by a patterning process using a normal mask, as shown in FIG. 1 and FIG. 2. After this patterning process, one end of the source electrode 6 is connected with the data line 11, the other end thereof is positioned over the semiconductor layer 4 and connected with the semiconductor layer 4 through the ohmic contact layer 4a in the third via hole 8c. One end of the drain electrode 7 is connected with the pixel electrode 9 through the first via hole 8a, the other end thereof is positioned over the semiconductor layer 4 and connected with the semiconductor layer 4 through the ohmic contact layer 4a in the second via hole 8b. The TFT channel region is formed between the source electrode 6 and the drain electrode 7. The common electrode line 12 is formed in the pixel region and constitutes the storage capacitor with the pixel electrode 9.

According to this embodiment of the TFT-LCD array substrate, the pixel electrode, the gate line and the gate electrode are formed by the first patterning process; the semiconductor layer is formed by the second patterning process; the first via hole, the second via hole and the third via hole are formed by the third patterning process, and the surface of the semiconductor layer exposed in the second via hole and the third via hole is treated by a surface treatment process so that the surface of the semiconductor layer in the second via hole and the third via hole is formed into the ohmic contact layer; the data line, the common electrode line, the source electrode and the drain electrode are formed by the fourth patterning process. Compared with the TFT-LCD array substrate manufactured with the conventional 4-mask process using a half-tone mask or a gray-tone mask, the TFT-LCD array substrate in this embodiment has the following advantages.

1. In this embodiment, the TFT channel region is formed by a patterning process using a normal mask after the semiconductor layer is formed, and the semiconductor layer is not over-etched, unlike the conventional process. Thus, the semiconductor layer in this embodiment can have a small thickness of about 500-1500 Å, preferably about 500-1000 Å. The thickness of the semiconductor layer is decreased, the turn-off current of the thin film transistor can be significantly reduced, the period of holding the voltage of the pixel electrode can be increased and the performance of the TFT-LCD array substrate can be improved. In addition, the thickness of the semiconductor layer is decreased, the contact resistance can be reduced and the carrier mobility in the TFT channel region can be improved.

2. In this embodiment, the semiconductor layer is kept from being physically bombed during the TFT channel region is formed, and thus the surface of the semiconductor layer is not damaged and the performance of the TFT-LCD array substrate can be further improved.

3. In this embodiment, the failures generated during the TFT channel region is formed by the conventional multiple-step etching process with a half-tone mask or a gray-tone mask can be avoided by forming the TFT channel region through a patterning process with a normal mask, and thus the product yield can be improved.

4. In this embodiment, the surface of the semiconductor layer in the second via hole and the third via hole is treated and formed into the ohmic contact layer. In this way, not only the electrical connection between the semiconductor layer and the source/drain electrode can be ensured, but also deposition of the conventional doped semiconductor layer can be omitted. That is, the process of depositing the doped semiconductor layer is omitted. Thus, the manufacture cost can be reduced, the process period can be shortened and the production efficiency can be improved.

Figure 13:
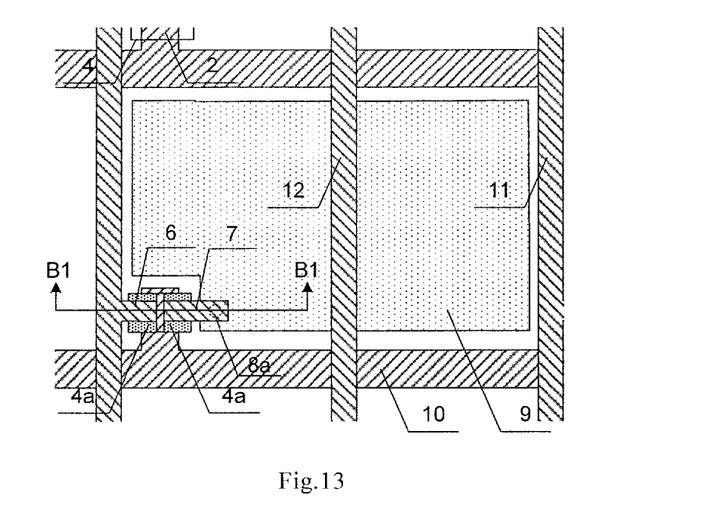
FIG. 13 is a plan view showing a second embodiment of a TFT-LCD array substrate according to the invention.
Figure 14:
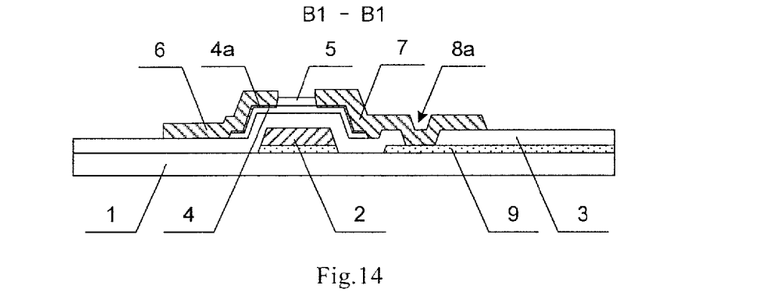
FIG. 14 is a sectional view taken along line B1-B1 in FIG. 1.

FIG. 13 is a plan view showing a second embodiment of a TFT-LCD array substrate according to the invention, and FIG. 14 is a sectional view taken along line B1-B1 in FIG. 1. As shown in FIG. 13 and FIG. 14, the TFT-LCD array substrate in this embodiment is manufactured by a different production process, in which the structures of the gate line 10, the data line 11, the common electrode line 12, the pixel electrode 9 and the like are similar to those in the first embodiment except for the structure of the thin film transistor.

Specifically, the TFT-LCD array substrate according to this embodiment comprises the gate electrode 2, the gate line 10 and the pixel electrode 9, which are all formed on a substrate 1. The gate electrode 2 is connected with the gate line 10. The pixel electrode 9 is formed on the substrate 1 and within the pixel region. The gate insulating layer 3 is formed on the gate electrode 2, the gate line 10 and the pixel electrode 9 to cover the entirety of the substrate 1. The first via hole 8a is provided in the gate insulating layer 3 and positioned on the pixel electrode 9. The semiconductor layer 4 is formed on the gate insulating layer 3 and over the gate electrode 2. A blocking layer 5 is provided on the semiconductor layer 4, and the surface of the semiconductor layer 4 on both sides of the blocking layer 5 is treated with a surface treatment process to form into the ohmic contact layer 4a. One end of the source electrode 6 is connected with the data line 11, and the other end thereof is positioned on the ohmic contact layer 4a on one side of the blocking layer 5 and connected with the semiconductor layer 4 through the ohmic contact layer 4a. One end of the drain electrode 7 is connected with the pixel electrode 9 through the first via hole 8a, and the other end thereof is positioned on the ohmic contact layer 4a on the other side of the blocking layer 5 and connected with the semiconductor layer 4 through the ohmic contact layer 4a. The TFT channel region is formed between the source electrode 6 and the drain electrode 7, and the blocking layer 5 is formed to cover the TFT channel region.

FIG. 15 to FIG. 23 are schematic views showing the manufacture process of the second embodiment of the TFT-LCD array substrate according to the invention.

The first patterning process and the structural patterns formed in this embodiment (such as the pixel electrode, the gate line and the gate electrode) are similar to those shown in FIG. 3 and FIG. 4 of the first embodiment, so the detailed descriptions thereof are omitted here for simplicity.

Figure 15:
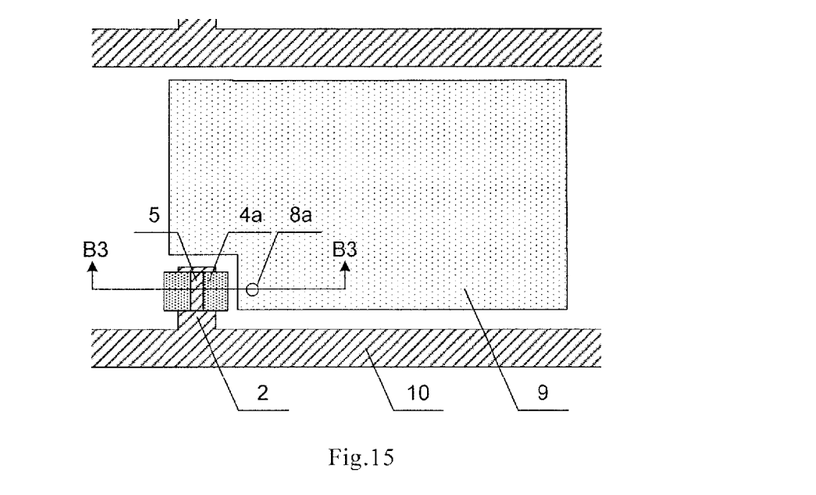
FIG. 15 is a plan view after a second patterning process of the second embodiment of the TFT-LCD array substrate according to the invention.
Figure 16:
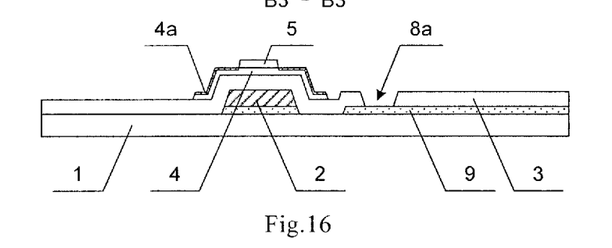
FIG. 16 is a sectional view taken along line B3-B3 in FIG. 15.

FIG. 15 is a plan view after a second patterning process of the second embodiment of the TFT-LCD array substrate according to the invention, and FIG. 16 is a sectional view taken along line B3-B3 in FIG. 15.

On the substrate with the patterns of the pixel electrode, the gate line and the gate electrode, the gate insulating layer 3 with a thickness of about 3000-5000 Å, the semiconductor film with a thickness of about 500-1500 Å and a blocking film with a thickness of about 1000-3000 Å are sequentially deposited by a PECVD method or other film formation method. The gate insulating layer and the blocking film may be formed by an oxide, nitride or oxynitride, and the corresponding source gases thereof may be a mixture of $SiH_4$, $NH_3$ and $N_2$ or a mixture of $SiH_2Cl_2$, $NH_3$ and $N_2$. The semiconductor film may be an amorphous silicon film, and the corresponding source gases thereof may be a mixture of $SiH_4$ and $H_2$ or a mixture of $SiH_2Cl_2$ and $H_2$. The semiconductor layer 4, the blocking layer 5 and the first via hole 8a are formed by a patterning process with a triple-tone mask, and then the surface of the semiconductor layer 4 on both sides of the blocking layer 5 is treated by a surface treatment process and therefore formed into the ohmic contact layer, as shown in FIG. 15 and FIG. 16. The semiconductor layer 4 is formed on the gate insulating layer 3 and over the gate electrode 2. The blocking layer 5 is formed on the semiconductor layer 4 and exposes the semiconductor layer 4 on both sides thereof. The first via hole 8a is provided at the pixel electrode 9 and near the gate electrode 2. In this patterning process, the gate pad via hole (not shown) can be simultaneously formed in the gate pad region. The structure of the gate pad via hole are well-known to those skilled in the art and the detailed descriptions thereof are omitted here. This patterning process will be described in detail as follows.

Figure 17:
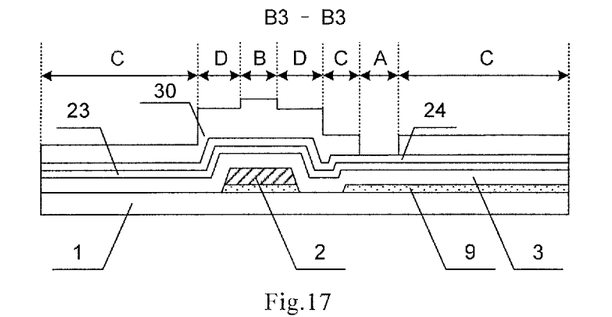
FIG. 17 is a sectional view taken along the line B3-B3 after exposing and developing a photoresist layer in the second patterning process of the second embodiment of the TFT-LCD array substrate according to the invention.

FIG. 17 is a sectional view taken along the line B3-B3 after exposing and developing a phororesist layer in the second patterning process of the second embodiment of the TFT-LCD array substrate according to the invention. Firstly, the gate insulating layer 3, the semiconductor film 23 and the blocking film 24 are sequentially deposited by a PECVD method or other film formation method. Then, a photoresist layer 30 is applied on the blocking film 24. The photoresist layer 30 is exposed by using a triple-tone mask to form a completely exposed region A, an unexposed region B, a first partially exposed region C and a second partially exposed region D. The completely exposed region A corresponds to the region of the first via hole, the unexposed region B corresponds to the region of the blocking layer, the second partially exposed region D corresponds to the region of the semiconductor layer, and the first partially exposed region C corresponds to the region other than the above regions. After the developing process is performed, the thickness of the photoresist in the unexposed region B is not substantially changed to form a photoresist-completely-retained region. The photoresist in the completely exposed region A is completely removed to form a photoresist-completely-removed region. The thickness of the photoresist in both of the first partially exposed region C and the second partially exposed region D is decreased to form a first photoresist-partially-retained region and a second photoresist-partially-retained region. The thickness of the photoresist in the second photoresist-partially-retained region is larger than that in the first photoresist-partially-retained region but smaller than that in the photoresist-completely-retained region, as shown in FIG. 17. The employed triple-tone mask has three regions with different transmissivities and an opaque region, and thus four regions with different exposure levels can be obtained by using the triple-tone mask. Various forms of tripe-tone mask, such as a half-tone mask with a slit, can be used in this patterning process.

Figure 18:
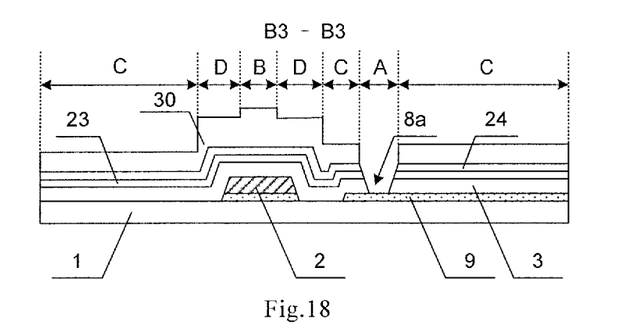
FIG. 18 is a sectional view taken along the line B3-B3 after a first etching process in the second patterning process of the second embodiment of the TFT-LCD array substrate according to the invention.

FIG. 18 is a sectional view taken along the line B3-B3 after a first etching process in the second patterning process of the second embodiment of the TFT-LCD array substrate according to the invention. By the first etching process, the blocking film 24, the semiconductor film 23 and the gate insulating layer 3 in the completely exposed region A is etched away to form the first via hole 8a. The first via hole 8a is provided on the pixel electrode 9 and near the gate electrode 2. The blocking film 24, the semiconductor film 23 and the gate insulating layer 3 in the first via hole 8a are etched away to expose the pixel electrode 9 in first via hole 8a, as shown in FIG. 18. In this patterning process, the gate pad via hole can be simultaneously formed in the gate pad region.

Figure 19:
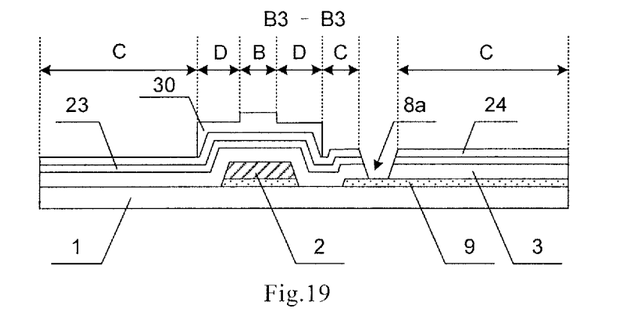
FIG. 19 is a sectional view taken along the line B3-B3 after a first ashing process in the second patterning process of the second embodiment of the TFT-LCD array substrate according to the invention.

FIG. 19 is a sectional view taken along the line B3-B3 after a first ashing process in the second patterning process of the second embodiment of the TFT-LCD array substrate according to the invention. By the first ashing process, the photoresist layer 30 in the first partially exposed region C is completely removed to expose the blocking film 24 in this region, as shown in FIG. 19. Since the thickness of the photoresist in the unexposed region B and the second partially exposed region D is larger than that in the first partially exposed region C, the unexposed region B and the second partially exposed region D are still covered by the remaining photoresist after this ashing process, and the thickness of the photoresist in the unexposed region B is still larger than that in the second partially exposed region D.

Figure 20:
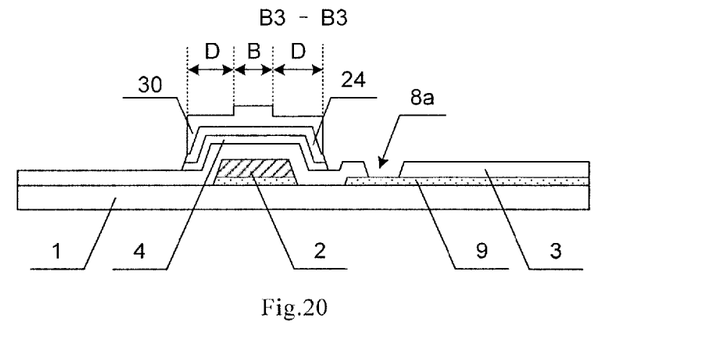
FIG. 20 is a sectional view taken along the line B3-B3 after a second etching process in the second patterning process of the second embodiment of the TFT-LCD array substrate according to the invention.

FIG. 20 is a sectional view taken along the line B3-B3 after a second etching process in the second patterning process of the second embodiment of the TFT-LCD array substrate according to the invention. By the second etching process, the blocking film 24 and the semiconductor film 23 in the first partially exposed region C are etched away to form the semiconductor layer 4. The semiconductor layer 4 is formed on the gate insulating layer 3 and positioned over the gate electrode 2, as shown in FIG. 20.

Figure 21:
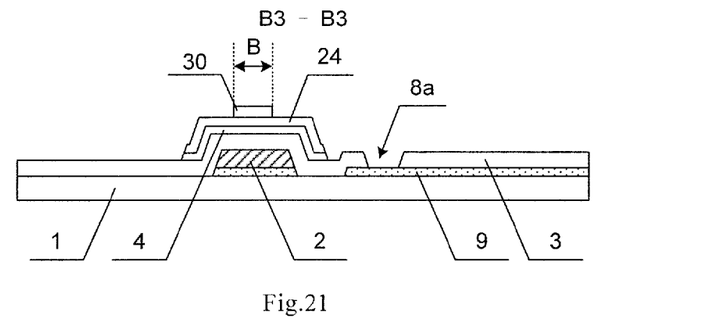
FIG. 21 is a sectional view taken along the line B3-B3 after a second ashing process in the second patterning process of the second embodiment of the TFT-LCD array substrate according to the invention.

FIG. 21 is a sectional view taken along the line B3-B3 after a second ashing process in the second patterning process of the second embodiment of the TFT-LCD array substrate according to the invention. By the second ashing process, the photoresist layer 30 in the second partially exposed region D is completely removed to expose the blocking film 24 in this region, as shown in FIG. 21. Since the thickness of the photoresist in the unexposed region B is larger than that in the second partially exposed region D, the unexposed region B is still covered by the remaining photoresist with a certain thickness after this process.

Figure 22:
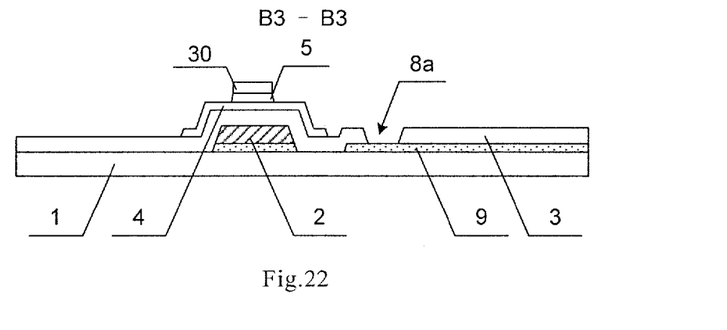
FIG. 22 is a sectional view taken along the line B3-B3 after a third etching process in the second patterning process of the second embodiment of the TFT-LCD array substrate according to the invention.

FIG. 22 is a sectional view taken along the line B3-B3 after a third etching process in the second patterning process of the second embodiment of the TFT-LCD array substrate according to the invention. By the third etching process, the blocking film 24 in the second partially exposed region D is etched away to form the blocking layer 5. As shown in FIG. 22, the blocking layer 5 is formed on semiconductor layer 4, and the semiconductor layer 4 is exposed on both sides of the blocking layer 5.

Figure 23:
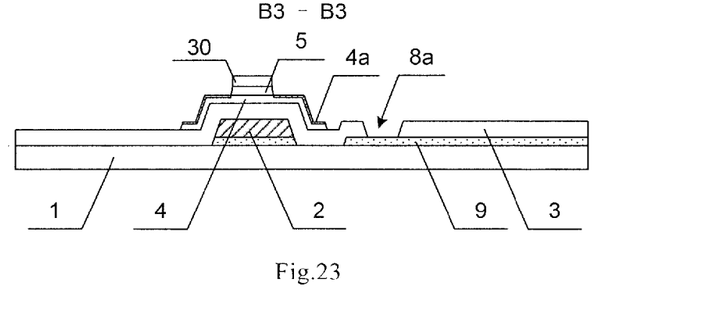
FIG. 23 is a sectional view taken along the line B3-B3 after a surface treatment process in the second patterning process of the second embodiment of the TFT-LCD array substrate according to the invention.

FIG. 23 is a sectional view taken along the line B3-B3 after a surface treatment process in the second patterning process of the second embodiment of the TFT-LCD array substrate according to the invention. By the surface treatment process, the exposed surface of the semiconductor layer 4 is treated and therefore formed into the ohmic contact layer 4a, as shown in FIG. 23. The surface treatment in this embodiment is a phosphorizing treatment using $PH_3$ gas, in which the RF power is about 5-12 KW, the atmospheric pressure is about 100-400 mT, and the flow rate is about 1000-4000 sccm.

Then, the remaining phororesist is removed to complete the manufacture process of the TFT-LCD array substrate in this embodiment. As shown in FIG. 15 and FIG. 16, after this patterning process, the semiconductor layer 4 is formed on the gate insulating layer 3 and positioned over the gate electrode 2, the blocking layer 5 is formed on the semiconductor layer 4, the semiconductor layer 4 exposed on both sides of the blocking layer 5 is formed into the ohmic contact layer 4a, the first via hole 8a is provided on the pixel electrode 9 and near the gate electrode, and the gate pad via hole (not shown) is formed in the gate pad region. The remaining photoresist may be removed before the surface treatment process is performed.

Finally, on the substrate with the pattern shown in FIG. 15, the source/drain metal film with a thickness of about 2000-3000 Å is deposited by using a magnetron sputtering method, a thermal evaporation method or other film formation method. The source/drain metal film may be formed by a metal such as Cr, W, Ti, Ta, Mo, Al, Cu and the like or an alloy of the above metals. In addition, the source/drain metal film may have a multi-layer structure formed by any combination of the above metals. The data line 11, the common electrode line 12, the source electrode 6 and the drain electrode 7 are formed by a patterning process using a normal mask, as shown in FIG. 13 and FIG. 14. After this patterning process, one end of the source electrode 6 is connected with the data line 11, and the other end thereof is positioned on the ohmic contact layer 4a on one side of the blocking layer 5 and connected with the semiconductor layer 4 through the ohmic contact layer 4a. One end of the drain electrode 7 is connected with the pixel electrode 9 through the first via hole 8a, and the other end thereof is positioned on the ohmic contact layer 4a on the other side of the blocking layer 5 and connected with the semiconductor layer 4 through the ohmic contact layer 4a. The TFT channel region is formed between the source electrode 6 and the drain electrode 7 and covered by the blocking layer 5. The common electrode line 12 is formed in the pixel region and constitutes the storage capacitor with the pixel electrode 9. In addition, the common electrode line may not be formed.

According to this embodiment of the TFT-LCD array substrate, the pixel electrode, the gate line and the gate electrode are formed by the first patterning process; the semiconductor layer, the blocking layer and the first via hole are formed by the second patterning process; and the data line, the common electrode line, the source electrode and the drain electrode are formed by the third patterning process. Since the over-etching process, and the physical bombing in the conventional technology are avoided in this embodiment, the TFT-LCD array substrate has the advantages similar to those in the first embodiment. In addition, since only three patterning processes are employed in this embodiment, the manufacture cost can be reduced and the production period can be shortened compared with the conventional technology with four patterning processes. Therefore, the production efficiency can be significantly improved.

Based on the above described embodiments, the TFT-LCD array substrate of the invention can be manufactured by increasing the number of the patterning processes and selecting different materials or material combinations. For example, the patterns formed in the first patterning process according to the embodiment may be completed by two patterning processes, that is, the pixel electrode is formed by a patterning process with a normal mask, the gate electrode and the gate line are formed by another patterning process with another normal mask, and the details of the two patterning processes are omitted here for simplicity.

According to the invention, the embodiment of a method of manufacturing a TFT-LCD array substrate may comprise the following steps:

Step 1, sequentially depositing a transparent conductive film and a gate metal film on a substrate, and forming a pixel electrode, a gate line and a gate electrode by a patterning process;

Step 2, depositing a gate insulating layer and a semiconductor film and forming a semiconductor layer by performing patterning processes on the substrate after the Step 1, wherein two separate parts of the surface of the semiconductor layer is treated by a surface treatment process to form into an ohmic contact layer; and Step 3, depositing a source/drain metal film on the substrate after the Step 2, and forming a data line, a source electrode and a drain electrode by a patterning process, wherein the source electrode and the drain electrode respectively are connected with the semiconductor layer through the ohmic contact layer.

In the method of the above embodiment, the surface treatment to the semiconductor layer is a phosphorizing treatment using $PH_3$ gas, in which the RF power is about 5-12 KW, the atmospheric pressure is about 100-400 mT and the flow rate is about 1000-4000 sccm. In addition, the thickness of the semiconductor layer is about 500-1500 Å, and preferably is about 500-1000 Å.

The embodiment of the method of manufacturing the TFT-LCD array substrate according to the invention will be described in detail through the following examples.

A first example of the method of manufacturing the TFT-LCD array substrate may comprise the following steps.

Step 11, sequentially depositing the transparent conductive film and the gate metal film on the substrate, and forming the pixel electrode, the gate line and the gate electrode by a patterning process;

Step 12, sequentially depositing the gate insulating layer and a semiconductor film by a PECVD method;

Step 13, forming the semiconductor layer by a patterning process with a normal mask, wherein the semiconductor layer is positioned over the gate electrode;

Step 14, depositing a passivation layer by a PECVD method;

Step 15, forming a first via hole, a second via hole and a third via hole by a patterning process with a normal mask, wherein the first via hole is provided on the pixel electrode and exposes the pixel electrode therein, and the second via hole and the third via hole are provided on the semiconductor layer;

Step 16, treating the surface of the semiconductor layer exposed in the second via hole and the third via hole so that the surface of the semiconductor layer in the second via hole and the third via hole is formed into the ohmic contact layer;

Step 17, depositing the source/drain metal film by a magnetron sputtering method or a thermal evaporation method; and Step 18, forming the data line, the source electrode and the drain electrode by a patterning process with a normal mask, wherein one end of the source electrode is connected with the data line, and the other end thereof is connected with the semiconductor layer through the ohmic contact layer in the third via hole; one end of the drain electrode is connected with pixel electrode through the first via hole, and the other end thereof is connected with the semiconductor layer through the ohmic contact layer in the second via hole; and a TFT channel region is formed between the source electrode and the drain electrode.

Further, a common electrode line may be formed in the Step 18. The common electrode line and the pixel electrode can constitute a storage capacitor.

In this example, the TFT-LCD array substrate is manufactured by four patterning process, in which the pixel electrode, the gate line and the gate electrode are formed by the first patterning process; the semiconductor layer is formed by the second patterning process; the first via hole, the second via hole and the third via hole are formed by the third patterning process, and the surface of the semiconductor layer exposed in the second via hole and the third via hole is treated so that the surface of the semiconductor layer in the second via hole and the third via hole is formed into the ohmic contact layer; the data line, the source electrode and the drain electrode are formed by the fourth patterning process. The manufacture process of this example has been described in detail with reference FIG. 3 to FIG. 12.

A second example of the method of manufacturing the TFT-LCD array substrate may comprise the following step.

Step 21, sequentially depositing the transparent conductive film and the gate metal film on the substrate, and forming the pixel electrode, the gate line and the gate electrode by a patterning process;

Step 22, sequentially depositing the gate insulating layer, a semiconductor film and a blocking film by a PECVD method;

Step 23, applying a photoresist layer on the blocking film, exposing the photoresist layer with a triple-tone mask to form a photoresist-completely-removed region, a photoresist-completely-retained region, a first photoresist-partially-retained region and a second photoresist-partially-retained region, wherein the photoresist-completely-removed region corresponds to the region of the first via hole to be formed, the photoresist-completely-retained region corresponds to the region of a blocking layer to be formed, the second photoresist-partially-retained region corresponds to the region of the semiconductor layer to be formed, and the first photoresist-partially-retained region corresponds to the region other than the above regions, and wherein after performing a developing process, the thickness of the photoresist in the photoresist-completely-retained region is not changed, the photoresist in the photoresist-completely-removed region is completely removed, the thickness of the photoresist in the first photoresist-partially-retained region and the second photoresist-partially-retained region is decreased, and the thickness of the photoresist in the second photoresist-partially-retained region is larger than that in the first photoresist-partially-retained region;

Step 24, etching away the blocking film, the semiconductor film and the gate insulating layer in the photoresist-completely-removed region by a first etching process to form the first via hole;

Step 25, completely removing the photoresist in the first photoresist-partially-retained region by a first ashing process to expose the blocking film in this region, and retaining the photoresist in the second photoresist-partially-retained region and the photoresist-completely-retained region;

Step 26, etching away the blocking film and the semiconductor film in the first photoresist-partially-retained region by a second etching process to form the semiconductor layer, wherein the semiconductor layer is positioned over the gate electrode;

Step 27, completely removing the photoresist in the second photoresist-partially-retained region by a second ashing process to expose the blocking film in this region, and retaining the photoresist in the photoresist-completely-retained region;

Step 28, etching away the blocking film in the second photoresist-partially-retained region by a third etching process to form the blocking layer, wherein the semiconductor layer is exposed on both sides of the blocking layer;

Step 29, treating the exposed surface of the semiconductor layer so that the surface of the semiconductor layer exposed on both sides of the blocking layer is formed into an ohmic contact layer, and removing the remaining photoresist; and Step 30, depositing the source/drain metal film by a magnetron sputtering method or a thermal evaporation method, and forming the data line, the source electrode and the drain electrode by a patterning process with a normal mask, wherein one end of the source electrode is connected with the data line, and the other end thereof is connected with the semiconductor layer through the ohmic contact layer on one side of the blocking layer; one end of the drain electrode is connected with pixel electrode through the first via hole, and the other end thereof is connected with the semiconductor layer through the ohmic contact layer on the other side of the blocking layer; and a TFT channel region is formed between the source electrode and the drain electrode.

Further, a common electrode line may be formed in the Step 30. The common electrode line and the pixel electrode constitute a storage capacitor.

In this example, the TFT-LCD array substrate is manufactured by three patterning process, in which the pixel electrode, the gate line and the gate electrode are formed by the first patterning process; the semiconductor layer, the blocking layer and the first via hole are formed by the second patterning process; and the data line, the source electrode and the drain electrode are formed by the third patterning process. The manufacture process of this example has been described in detail with reference FIG. 15 to FIG. 23.

In the above examples, the surface treatment to the semiconductor layer is a phosphorizing treatment using $PH_3$ gas, in which the RF power is about 5-12 KW, the atmospheric pressure is about 100-400 mT and the flow rate is about 1000-4000 sccm.

The above Step 1 (comprising the Step 11 or the Step 21) may be performed as follows:

sequentially depositing the transparent conductive film and the gate metal film on the substrate by a magnetron sputtering method or a thermal evaporation method;

applying a photoresist layer on the gate metal film;

exposing the photoresist by a half-tone mask or a gray-tone mask to form a photoresist-completely-removed region, a photoresist-completely-retained region and a photoresist-partially-retained region, wherein the photoresist-completely-retained region corresponds to the region of the gate line and the gate electrode, the photoresist-partially-retained region corresponds to the region of the pixel electrode, and the photoresist-completely-removed region corresponds to the region other than the above regions, and wherein after performing a developing process, the thickness of the photoresist in the photoresist-completely-retained region is not changed, the photoresist in the photoresist-completely-removed region is completely removed, and the thickness of the photoresist in the photoresist-partially-retained region is decreased;

etching away the gate metal film and the transparent conductive film in the photoresist-completely-removed region by a first etching process to form the gate electrode and the gate line;

completely removing the photoresist in the photoresist-partially-retained region by an ashing process to expose the gate metal film in this region and retaining the photoresist in the photoresist-completely-retained region;

etching away the gate metal film in the photoresist-partially-retained region by a second etching process to form the pixel electrode; and removing the remaining photoresist.

In the above Step 1, the pixel electrode, the gate line and the gate electrode are simultaneously formed in a same patterning process by multi-step etching process. The manufacture process of the Step 1 has been described in detail with reference FIG. 5 to FIG. 8.

By the method of manufacturing the TFT-LCD array substrate according to the embodiments of the invention, the conventional over-etching process and the conventional physical bombing to the semiconductor layer can be avoided, and the multi-step etching process during forming the conventional TFT channel region can also be avoided, thus the semiconductor layer can have a small thickness such as 500-1500 Å. Therefore, the turn-off current of the thin film transistor can be significantly decreased, the period of holding the voltage of the pixel electrode can be increased, the performance of the TFT-LCD array substrate can be improved and the product yield can be increased. In the second embodiment employing three patterning processes, the cost can be further reduced and the production period can be further shorted compared to the conventional method employing four patterning processes.

It should be appreciated that the embodiments described above are intended to illustrate but not limit the present invention. Although the present invention has been described in detail herein with reference to the preferred embodiments, it should be understood by those skilled in the art that the present invention can be modified and some of the technical features can be equivalently substituted without departing from the spirit and scope of the present invention.

What is claimed is:

1. A method of manufacturing a thin film transistor liquid crystal display (TFT-LCD) array substrate, comprising:
    Step 1 of sequentially depositing a transparent conductive film and a gate metal film on a substrate, and patterning the transparent conductive film and the gate metal film to form a pixel electrode, a gate line and a gate electrode;
    Step 2 of depositing a gate insulating layer and a semiconductor film on the substrate after the Step 1 and patterning the semiconductor film to form a semiconductor layer, wherein two separate parts of the surface of the semiconductor layer is treated by a surface treatment process to form into an ohmic contact layer; and
    Step 3 of depositing a source/drain metal film on the substrate after the Step 2, and patterning the source/drain metal film to form a data line, a source electrode and a drain electrode by a patterning process, wherein the source electrode and the drain electrode respectively are connected with the semiconductor layer through the ohmic contact layer in the two separate parts;
    wherein the Step 2 comprises:
    sequentially depositing the gate insulating layer, the semiconductor film and a blocking film on the substrate after the Step 1;
    applying a photoresist layer on the blocking film;
    exposing the photoresist layer by a triple-tone mask to form a photoresist-completely-removed region, a photoresist-completely-retained region, a first photoresist-partially-retained region and a second photoresist-partially-retained region, wherein the photoresist-completely-removed region corresponds to the region of a first via hole, the photoresist-completely-retained region corresponds to the region of a blocking layer, the second photoresist-partially-retained region corresponds to the region of the semiconductor layer, and the first photoresist-partially-retained region corresponds to the region other than the above regions, and wherein after performing a developing process, the thickness of the photoresist in the photoresist-completely-retained region is not changed, the photoresist in the photoresist-completely-removed region is completely removed, the thickness of the photoresist in the first photoresist-partially-retained region and the second photoresist-partially-retained region is decreased, and the thickness of the photoresist in the second photoresist-partially-retained region is larger than that in the first photoresist-partially-retained region;
    etching away the blocking film, the semiconductor film and the gate insulating layer in the photoresist-completely-removed region by a first etching process to form the first via hole;
    completely removing the photoresist in the first photoresist-partially-retained region by a first ashing process to expose the blocking film in this region and retaining the photoresist in the second photoresist-partially-retained region and the photoresist-completely-retained region;
    etching away the blocking film and the semiconductor film in the first photoresist-partially-retained region by a second etching process to form the semiconductor layer, wherein the semiconductor layer is positioned over the gate electrode;
    completely removing the photoresist in the second photoresist-partially-retained region by a second ashing process to expose the blocking film in this region, and retaining the photoresist in the photoresist-completely-retained region;
    etching away the blocking film in the second photoresist-partially-retained region by a third etching process to form the blocking layer, wherein the semiconductor layer is exposed on both sides of the blocking layer;
    treating the exposed surface of the semiconductor layer by the surface treatment so that the surface of the semiconductor layer exposed on both sides of the blocking layer is formed into the ohmic contact layer, and
    removing the remaining photoresist.

2. The method of claim 1, wherein the Step 3 comprises:
    depositing the source/drain metal film on the substrate after the Step 2, and
    forming the data line, the source electrode and the drain electrode by a patterning process with a normal mask,
    wherein one end of the source electrode is connected with the data line, and the other end thereof is connected with the semiconductor layer through the ohmic contact layer on one side of the blocking layer; one end of the drain electrode is connected with pixel electrode through the first via hole, and the other end thereof is connected with the semiconductor layer through the ohmic contact layer on the other side of the blocking layer; and a TFT channel region is formed between the source electrode and the drain electrode.

* * * * *